United States Patent
Kobayashi et al.

(10) Patent No.: US 10,056,518 B2
(45) Date of Patent: Aug. 21, 2018

(54) ACTIVE PHOTONIC DEVICE HAVING A DARLINGTON CONFIGURATION

(71) Applicant: RF Micro Devices, Inc., Greensboro, NC (US)

(72) Inventors: Kevin Wesley Kobayashi, Redondo Beach, CA (US); Ricke Waylan Clark, Morrison, CO (US)

(73) Assignee: Qorvo US, Inc., Greensboro, NC (US)

( * ) Notice: Subject to any disclaimer, the term of this patent is extended or adjusted under 35 U.S.C. 154(b) by 196 days.

(21) Appl. No.: 14/746,958

(22) Filed: Jun. 23, 2015

(65) Prior Publication Data

US 2015/0372181 A1    Dec. 24, 2015

Related U.S. Application Data

(60) Provisional application No. 62/015,621, filed on Jun. 23, 2014, provisional application No. 62/029,649, filed on Jul. 28, 2014.

(51) Int. Cl.
*H01L 31/11* (2006.01)
*H01L 29/205* (2006.01)
(Continued)

(52) U.S. Cl.
CPC ...... *H01L 31/1105* (2013.01); *H01L 27/1443* (2013.01); *H01L 29/0692* (2013.01);
(Continued)

(58) Field of Classification Search
CPC ............ H01L 31/1105; H01L 29/0692; H01L 29/7371; H01L 29/0817; H01L 29/41708;
(Continued)

(56) References Cited

U.S. PATENT DOCUMENTS 3,046,405 A * 7/1962 Emeis ............... H01L 21/00
257/47
3,868,722 A   2/1975 Le Can et al.
(Continued)

OTHER PUBLICATIONS

Bilenca, A. et al., "Millimeter-wave generation and digital modulation in an InGaAs—InP heterojunction phototransistor: model and experimental characterization of dynamics and noise," Journal of Lightwave Technology, IEEE Aerospace and Electronic Systems Society, vol. 19, No. 9, Sep. 2001, pp. 1340-1351.
(Continued)

*Primary Examiner* — Stephen W Smoot
*Assistant Examiner* — Sun M King
(74) *Attorney, Agent, or Firm* — Withrow & Terranova, P.L.L.C.

(57) ABSTRACT

An active photonic device having a Darlington configuration is disclosed. The active photonic device includes a substrate with a collector layer over the substrate. The collector layer includes an inner collector region and an outer collector region that substantially surrounds the inner collector region. A base layer resides over the collector layer. The base layer includes an inner base region and an outer base region that substantially surrounds and is spaced apart from the inner base region. An emitter layer resides over the base layer. The emitter layer includes an inner emitter region that is ring-shaped and resides over and extends substantially around an outer periphery of the inner base region. The emitter layer further includes an outer emitter region that is ring-shaped and resides over and extends substantially around the outer base region. A connector structure electrically couples the inner emitter region with the outer base region.

23 Claims, 8 Drawing Sheets

(51) Int. Cl.

| | | |
|---|---|---|
| *H01L 29/10* | (2006.01) | |
| *H01L 29/417* | (2006.01) | |
| *H01L 27/144* | (2006.01) | |
| *H01L 29/737* | (2006.01) | |
| *H01L 29/06* | (2006.01) | |
| H01L 29/08 | (2006.01) | |
| H01L 27/02 | (2006.01) | |
| H01L 27/06 | (2006.01) | |
| H01L 27/082 | (2006.01) | |

(52) U.S. Cl.
CPC ...... *H01L 29/0817* (2013.01); *H01L 29/1004* (2013.01); *H01L 29/205* (2013.01); *H01L 29/41708* (2013.01); *H01L 29/7371* (2013.01); H01L 27/0207 (2013.01); H01L 27/0605 (2013.01); H01L 27/0825 (2013.01); H01L 29/0821 (2013.01)

(58) Field of Classification Search
CPC ............... H01L 29/205; H01L 27/1443; H01L 27/0825; H01L 27/0207; H01L 27/0605; H01L 29/0821–29/0826; H01L 29/1004–29/1008
See application file for complete search history.

(56) References Cited

U.S. PATENT DOCUMENTS

| | | | |
|---|---|---|---|
| 4,236,119 A | 11/1980 | Battjes | |
| 4,951,106 A | 8/1990 | Blouke | |
| 4,977,314 A | 12/1990 | Niwa | |
| 5,502,338 A | 3/1996 | Suda et al. | |
| 5,541,439 A * | 7/1996 | Mojaradi | H01L 27/0825 257/488 |
| 6,465,289 B1 | 10/2002 | Streit et al. | |
| 6,504,429 B2 | 1/2003 | Kobayashi | |
| 7,067,853 B1 * | 6/2006 | Yao | H01L 27/14681 257/184 |
| 2003/0160266 A1 * | 8/2003 | Yanagisawa | H01L 29/66318 257/197 |
| 2003/0218185 A1 * | 11/2003 | Ohbu | H01L 29/0692 257/197 |
| 2004/0065900 A1 * | 4/2004 | Umemoto | H01L 27/0259 257/200 |
| 2008/0087918 A1 * | 4/2008 | Arendt | H01L 29/0692 257/197 |
| 2017/0097261 A1 | 4/2017 | Koabayashi | |

OTHER PUBLICATIONS

Prakash, D. P. et al., "Integration of Polyimide Waveguides with Traveling-Wave Phototransistors," IEEE Photonics Technology Letters, IEEE, vol. 9, No. 6, Jun. 1997, pp. 800-802.

Scott, D. C. et al., "60 GHz Sources Using Optically Driven HBTs," IEEE MTT-S International Microwave Symposium Digest, IEEE, vol. 2, Jun. 1-5, 1992, pp. 811-814.

Scott, D. C. et al., "High-Power High-Frequency Traveling-Wave Heterojunction Phototransistors with Integrated Polyimide Waveguide," IEEE Microwave and Guided Wave Letters, IEEE, vol. 8, No. 8, Aug. 1998, pp. 284-286.

Author Unknown, "043643: 10Gb/s InGaAs/InAlAs Avalanche Photodetector (APD) Die," Spectrolab, Revision A, May 24, 2012, 2 pages.

Author Unknown, "AP1503-20L5: 10 Gb/s 1550nm Avalanche Photodiode," SiFotonics, Jul. 2013, 1 page.

Author Unknown, "Ge/Si APD," SiFotonics, 2015, 1 page, http://sifotonics.com/en/index.php?m=default.product_apd&bid=7.

Author Unknown, "Welcome to Spectrolab," Spectrolab: A Boeing Company, 2009-2014, www.spectrolab.com.

Author Unknown, "World Best 25G APD," SiFotonics, 2016, 1 page, www.sifotonics.com.

Hong, Li et al., "High bandwidth surface-illuminated InGaAs/InP uni-travelling-carrier photodetector," Chinese Physics B, vol. 22, No. 11, 2013, 5 pages.

De Barros, Jr., L.E.M et al., "Noise Performance of HBT as Photodetector in Analog Fiber-optic Communication Link," SBMO/IEEE MTT-S IMOC'97 Proceedings, Aug. 1997, IEEE, pp. 338-343.

Gonzalez, C. et al., "A 28 GHz HPT/HBT Monolithically Integrated Photoreceiver for Hybrid Fibre Radio Distribution Systems," 2000 8th IEEE International Symposium on High Performance Electron Devices for Microwave and Optoelectronic Applications, Nov. 2000, pp. 55-60.

Jo, Young-Chang et al., "Optical Properties of 1 by 16 Highly Sensitive InP/InGaAs Heterojunction Phototransistor Arrays," Proceedings of IEEE Sensors, 2004, pp. 1305-1307.

Kosaka, Hideo, "Smart Integration and Packaging of 2-D VCSEL's for High-Speed Parallel Links," IEEE Journal of Selected Topics in Quantum Electronics, vol. 5, No. 2, Mar./Apr. 1999, pp. 184-192.

Moriizumi, Toyosaka et al., "Theoretical Analysis of Heterojunction Phototransistors," IEEE Transactions on Electron Devices, vol. 19, No. 2, Feb. 1972, pp. 152-159.

Pei, Z. et al., "Integratable SiGe Phototransistor with High Speed (BW=3 GHz) and Extremely-High Avalanche Responsivity," 2003 International Semiconductor Device Research Symposium, Dec. 2003, pp. 18-19.

Wang, H. et al., "GaAs/GaAlAs Heterojunction Bipolar Phototransistor for Monolithic Dhotoreceiver Operating at 140 Mbit/s," 1986 IEEE MTT-S International Microwave Symposium Digest, 1986, pp. 717-719.

Notice of Allowance for U.S. Appl. No. 15/219,879, dated Dec. 1, 2017, 9 pages.

Non-Final Office Action for U.S. Appl. No. 15/332,727, dated Apr. 16, 2018, 9 pages.

\* cited by examiner

ACTIVE PHOTONIC DEVICE HAVING A DARLINGTON CONFIGURATION

RELATED APPLICATIONS

This application claims the benefit of U.S. provisional patent application No. 62/015,621, filed Jun. 23, 2014, and claims the benefit of U.S. provisional patent application No. 62/029,649, filed Jul. 28, 2014, the disclosures of which are incorporated herein by reference in their entireties.

FIELD OF THE DISCLOSURE

The present disclosure relates to active photonic devices. In particular, the present disclosure relates to geometric configurations for active photonic devices that are usable as light detectors in optical communication receivers.

BACKGROUND

Fiber-optic communication provides a major portion of the backbone of the Internet. As such, photonic devices such as lasers are used for lightwave signal transmission and photodiodes (PDs) are used for lightwave signal reception. These traditional photonic devices have parasitic inductances and parasitic capacitances that limit high frequency operation for high data rate applications such as 100 Gbps serial communications that are transmitted and received using lightwave signals. Moreover, a particularly sensitive photodiode, known as an avalanche photodiode (APD), is used in long haul (LH) fiber optic communication and requires a relatively high supply voltage of on the order of 50V and greater for proper operation. Thus, what is needed is an active photonic device that has substantially reduced parasitic inductances and reduced parasitic capacitances such that high data rates of 100 Gbps and higher are achievable using lightwave signals. Moreover, the needed active photonic device preferably operates with a relatively low supply voltage of around 3V.

SUMMARY

An active photonic device having a Darlington configuration is disclosed. The active photonic device includes a substrate with a collector layer over the substrate. The collector layer includes an inner collector region and an outer collector region that substantially surrounds the inner collector region. A base layer resides over the collector layer. The base layer includes an inner base region and an outer base region that substantially surrounds and is spaced apart from the inner base region. An emitter layer resides over the base layer. The emitter layer includes an inner emitter region that is ring-shaped and resides over and extends substantially around an outer periphery of the inner base region. The emitter layer further includes an outer emitter region that is ring-shaped and resides over and extends substantially around the outer base region. A connector structure electrically couples the inner emitter region with the outer base region.

In one exemplary embodiment, the active photonic device is a heterojunction bipolar transistor-photonic device (HBT-PD) with a common-collector P-i-N structure, wherein a "P" layer in the P-i-N structure is a p-doped layer; an "i" layer is an undoped intrinsic layer or a lightly-doped layer; and an "N" layer is an n-doped layer. In a second exemplary embodiment, the active photonic device is an HBT-PD with an isolated collector P-i-N structure. In a third exemplary embodiment, the active photonic device is an HBT-PD that is adapted to receive back-side illumination from a light signal. In a fourth exemplary embodiment, the active photonic device is an HBT-PD that is adapted to receive edge illumination from a light signal.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Figure 1:
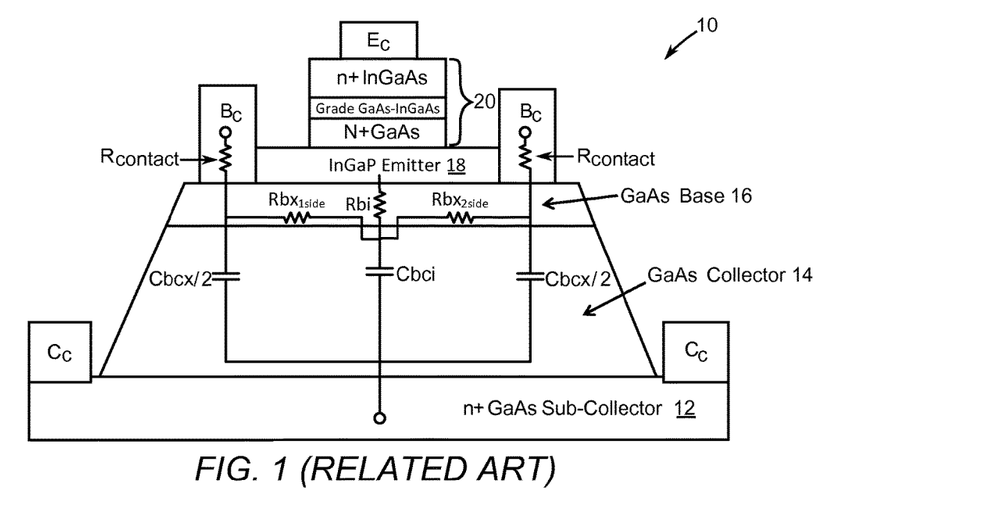
FIG. 1 is a vertical cross-section diagram of a related art indium gallium phosphide/gallium arsenide (InGaP/GaAs) heterojunction bipolar transistor (HBT).
Figure 2:
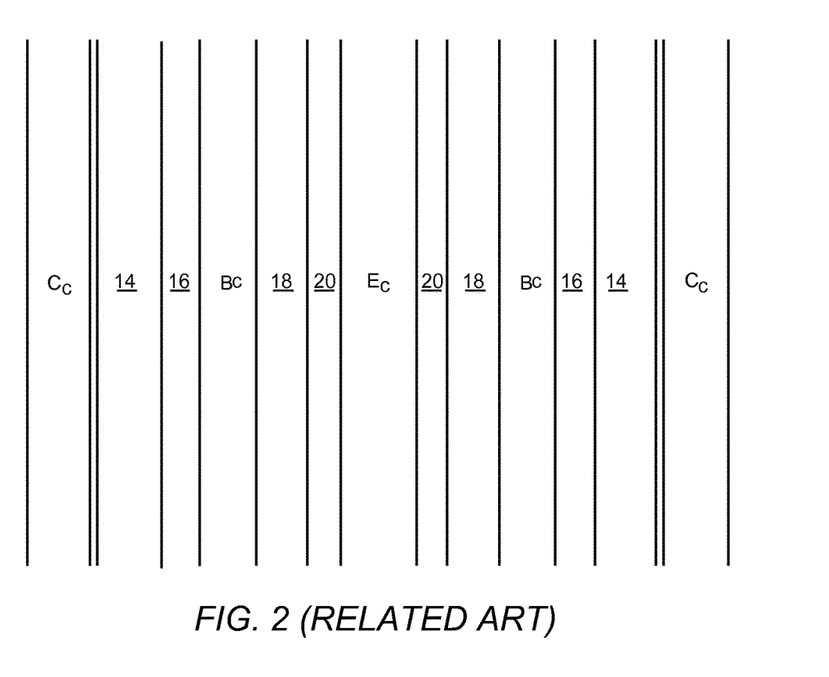
FIG. 2 is a corresponding top view diagram of the InGaP/GaAs HBT of FIG. 1.

FIG. 1 is a vertical cross-section diagram of a related art indium gallium phosphide/gallium arsenide (InGaP/GaAs) heterojunction bipolar transistor (HBT) 10. The related art InGaP/GaAs HBT 10 is a traditional transistor having a stripe structure. FIG. 2 is a corresponding top view diagram of the InGaP/GaAs HBT 10 of FIG. 1.

As best seen in FIG. 1, the related art InGaP/GaAs HBT 10 has a first epitaxial layer that is a relatively heavily doped n+ GaAs Sub-Collector 12. A collector contact $C_C$ is disposed onto an outer periphery of the n+ GaAs Sub-Collector 12. A second epitaxial layer is a GaAs collector 14 that resides over the n+ GaAs Sub-Collector 12. A third epitaxial layer is a GaAs Base 16 that is disposed over the GaAs collector 14. Referring now to both FIG. 1 and FIG. 2, a base contact $B_C$ is disposed onto the GaAs Base 16 and has a contact resistance $R_{contact}$. A fourth epitaxial layer is an InGaP Emitter 18 that is disposed onto the GaAs Base 16 within an inner area between the base contact $B_C$. Emitter interfacial layers 20 are centrally disposed over the InGaP Emitter 18. The emitter interfacial layers comprise an N+ GaAs layer, a grade GaAs—InGaAs layer, and an n+ InGaAs layer. An emitter contact $E_C$ is disposed on top of the emitter interfacial layers 20.

The vertical cross-section view of FIG. 1 also depicts components of small signal model parameters that include an intrinsic base resistance (Rbi), a first side base extrinsic resistance ($Rbx_{1side}$), a second side base extrinsic resistance ($Rbx_{2side}$), base to collector intrinsic capacitance (Cbci), and half value base to collector extrinsic capacitances (Cbcx/2) that are depicted in their approximate physical locations. The present disclosure provides a new transistor structure that substantially reduces the respective values of resistance and capacitance for the components of the small signal parameters depicted in FIG. 1.

Figure 3:
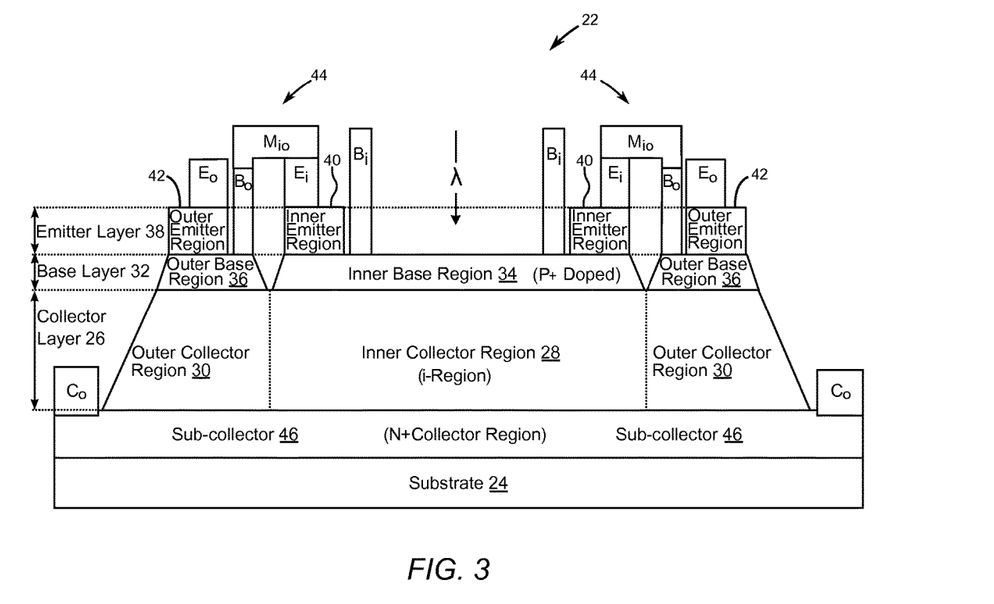
FIG. 3 is a vertical cross-section diagram of an active photonic device that is exemplarily depicted as a heterojunction bipolar transistor-photonic device (HBT-PD) in a Darlington configuration with a common-collector P-i-N structure.
Figure 4:
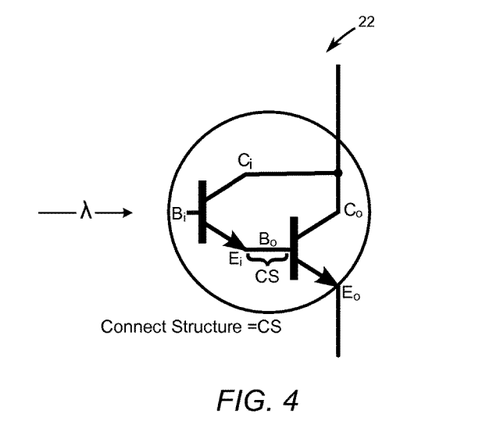
FIG. 4 is a symbolic diagram representing the active photonic device of FIG. 3.
Figure 5:
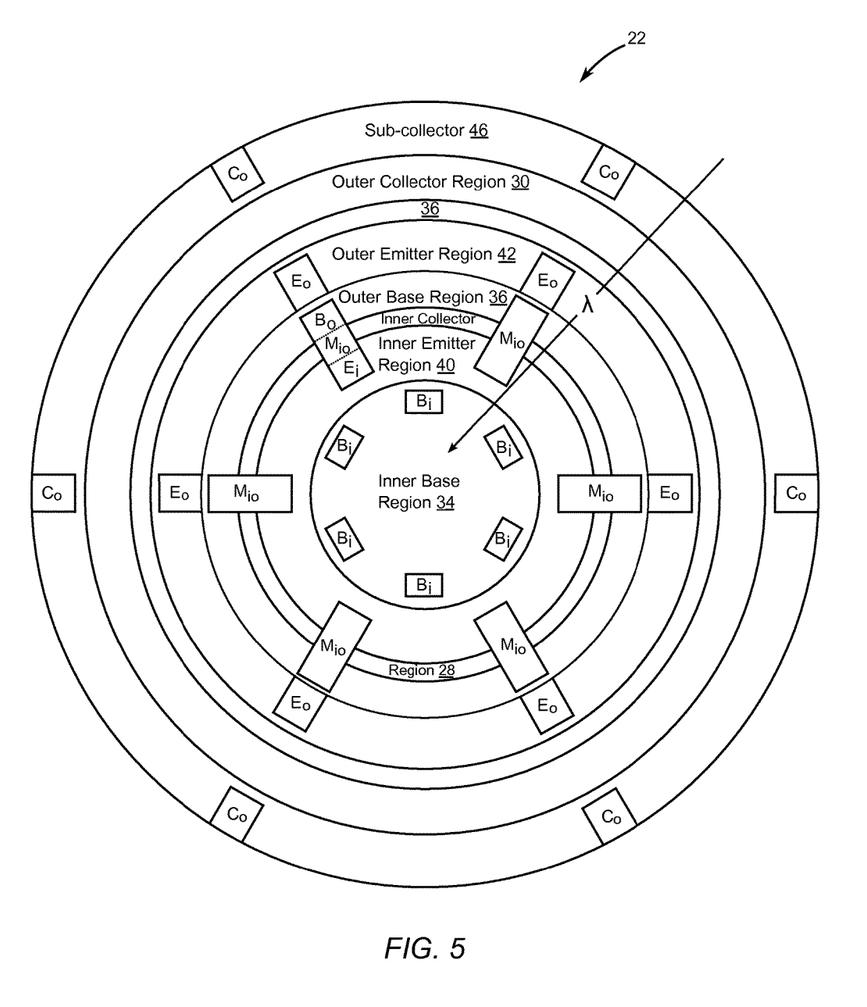
FIG. 5 is a horizontal cross-section diagram of the active photonic device of FIG. 3 that shows circular transistor elements that comprise the active photonic device.

In this regard, FIG. 3 is a vertical cross-section diagram of an active photonic device 22 in a Darlington configuration that is shown symbolically in FIG. 4. Note that the exemplary embodiment depicted in FIG. 3 is a heterojunction bipolar transistor-photonic device (HBT-PD). FIG. 5 is a horizontal cross-section diagram that shows a circular structure of the active photonic device 22 that is in contrast to the stripe structure of InGaP/GaAs HBT 10 of FIG. 1.

Referring to both FIG. 3 and FIG. 5, the active photonic device 22 has a substrate 24 with a collector layer 26 over the substrate 24. The collector layer 26 has an inner collector region 28 and an outer collector region 30 that substantially surrounds the inner collector region 28.

The active photonic device 22 also includes a base layer 32 that resides over the collector layer 26. The base layer 32 includes an inner base region 34, and an outer base region 36 that substantially surrounds and is spaced apart from the inner base region 34. In this particular embodiment, the inner base region 34 is open to receive a light signal λ.

The active photonic device 22 further includes an emitter layer 38 over the base layer 32. The emitter layer 38 includes an inner emitter region 40 that is ring shaped and resides over and extends substantially around an outer periphery of the inner base region 34. The emitter layer 38 further includes an outer emitter region 42 that is ring-shaped and resides over and extends substantially around the outer base region 36. A connector structure 44 electrically couples the inner emitter region 40 with the outer base region 36. The connector structure 44 includes a metal conductor $M_{io}$ that couples an inner emitter contact $E_i$ disposed on the inner emitter region 40 to an outer base contact $B_o$ disposed on the outer base region 36. The inner emitter contact $E_i$ is typically made up of the emitter interfacial layers 20 depicted in FIG. 1. An electrical signal corresponding to a light signal is typically output from the outer collector contact $C_O$.

An inner base contact $B_i$, disposed onto the inner base region 34, is usable to couple to external circuitry (not shown) that is typically bias networks and/or feedback networks. However, in at least one embodiment the inner base contact $B_i$ is not included to provide more light gathering area. An outer emitter contact $E_o$ is disposed on the outer emitter region 42. The outer emitter contact $E_o$ is typically coupled to a fixed voltage node such as ground. A sub-collector 46 is typically provided to reside between the substrate 24 and the collector layer 26. The sub-collector 46 is an active collector region that is heavily N doped. Note that the exemplary embodiment of the active photonic device 22 has a common-collector P-i-N structure. As such, a P-i-N type photo detector is formed by the base layer 32, the collector layer 26, and the sub-collector 46. In this particular exemplary embodiment, the inner base region 34 is a P-layer that is p-doped, the inner collector region 28 is an i-layer that is intrinsic, and the sub-collector 46 is an N-layer that is n-doped to form a P-i-N structure. In one embodiment, the inner collector region 28 is undoped and in another embodiment, the inner collector region 28 is lightly doped.

The inner collector region 28, the inner base region 34 and the inner emitter region 40 form a first transistor, and the outer collector region 30, the outer base region 36, and the outer emitter region 42 form a second transistor. The first transistor and second transistor are configured as a heterojunction bipolar transistor-photonic device (HBT-PD).

In operation, an exposed center window of the inner base region 34 receives an incident data modulated lightwave signal λ that is converted to an electrical photo-induced current in the P-i-N structure, and subsequently becomes amplified by a forward current gain, Beta^2, of the Darlington configuration of the active photonic device 22. This is in contrast to a traditional avalanche photodiode (APD) in which diode carrier avalanching occurs to increase the photo detector current through noisy avalanche multiplication, the active photonic device 22 is used to cleanly amplify an input current by Beta^2. In another embodiment, the current gain may be traded off for bandwidth by adding shunt impedance to ground from the inner emitter contact $E_i$. Thus, the active photonic device 22 provides more flexibility to trade off bandwidth, noise, and linearity by including appropriate supporting circuitry such as parallel and series feedback to the active photonic device 22. In effect, the active photonic device 22 is configurable to provide the function of transimpedance, converting amplified input current to voltage with lower noise amplification than an APD while operating from a lower voltage supply that is ~10 times smaller than a typical APD device (e.g., 5V vs. 50V). In one embodiment, the active photonic device 22 is configured to operate from a supply voltage that ranges from around about 1V to about 5V. In another embodiment, the active photonic device 22 is configured to operate from a supply voltage that ranges from 5V to around about 10V. Further still, the active photonic device 22 is configured to receive a modulated light signal with a bit rate of at least 100 Gbps and output an electrical signal of at least 100 Gbps.

Figure 6:
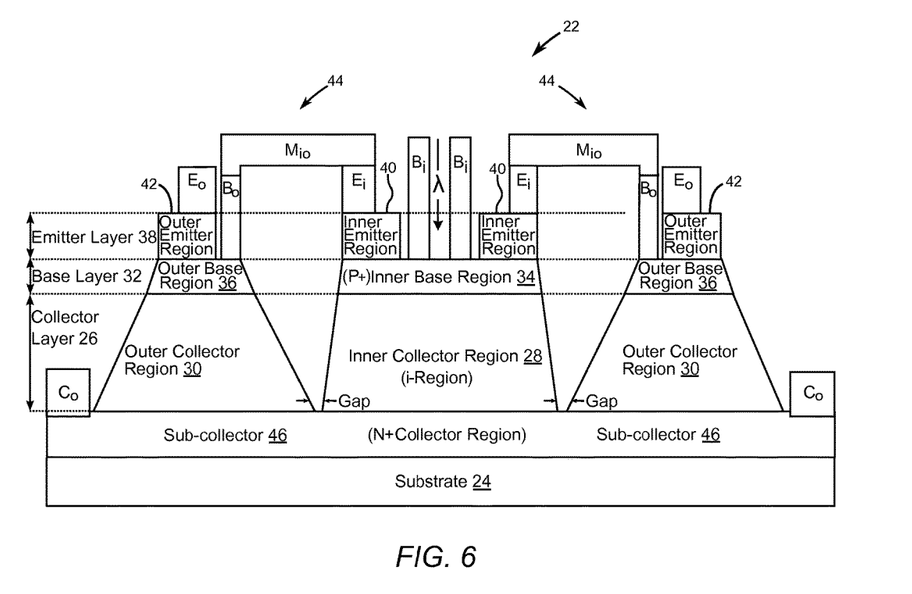
FIG. 6 is a vertical cross-section of a second embodiment of the active photonic device that is exemplarily depicted as an HBT-PD in a Darlington configuration that includes an isolated-collector P-i-N detector.
Figure 7:
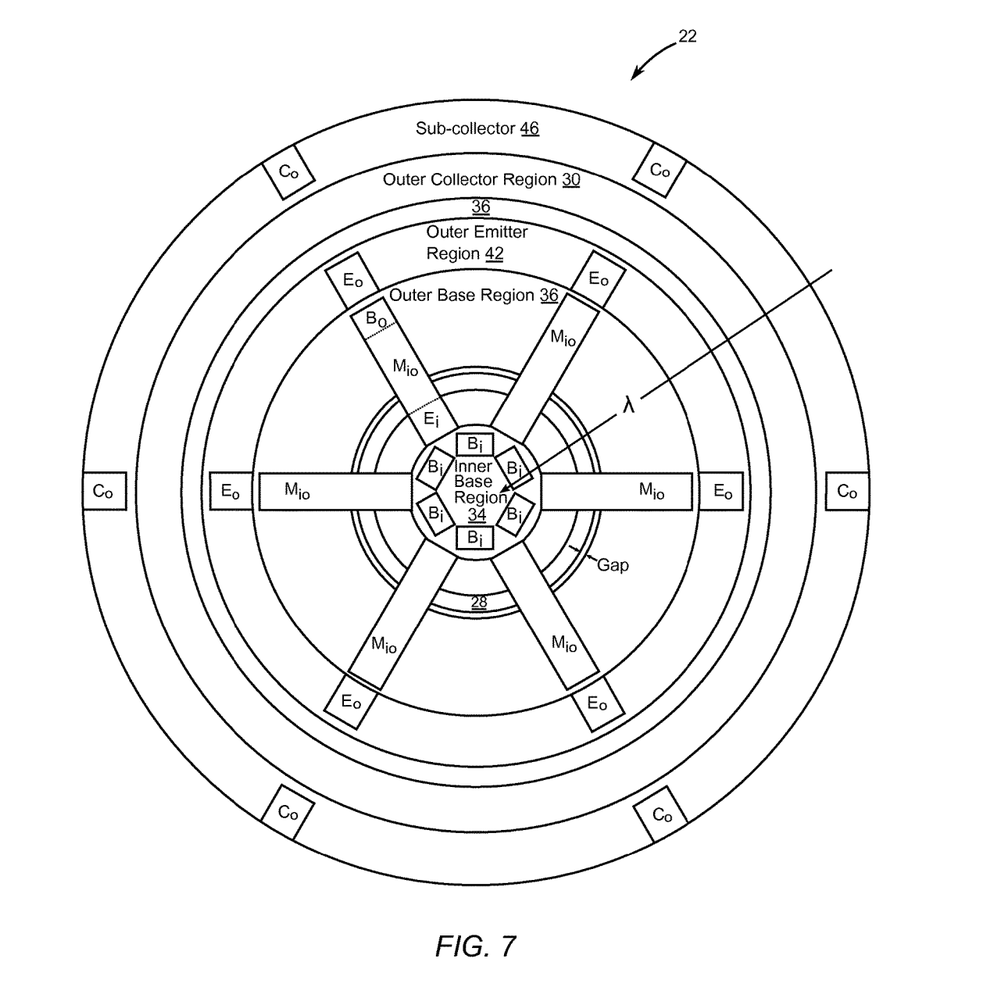
FIG. 7 is a horizontal cross-section diagram of the active photonic device of FIG. 6 that shows circular transistor elements that comprise the active photonic device.

FIG. 6 is a vertical cross-section of a second embodiment of the active photonic device 22 that is exemplarily depicted as an HBT-PD in a Darlington configuration that includes an isolated-collector P-i-N detector. FIG. 7 is a horizontal cross-section diagram of the active photonic device 22 of FIG. 6 that shows circular transistor elements that comprise the active photonic device 22. In this particular embodiment, mesas that comprise the inner collector region 28 and the outer collector region 30 are isolated from each other within the collector layer 26 by a gap. However, the outer collector region 30 and the inner collector region 28 share the sub-collector 46. The isolated-collector P-i-N detector makes this second embodiment particularly usable for fiber-optic applications.

Figure 8:
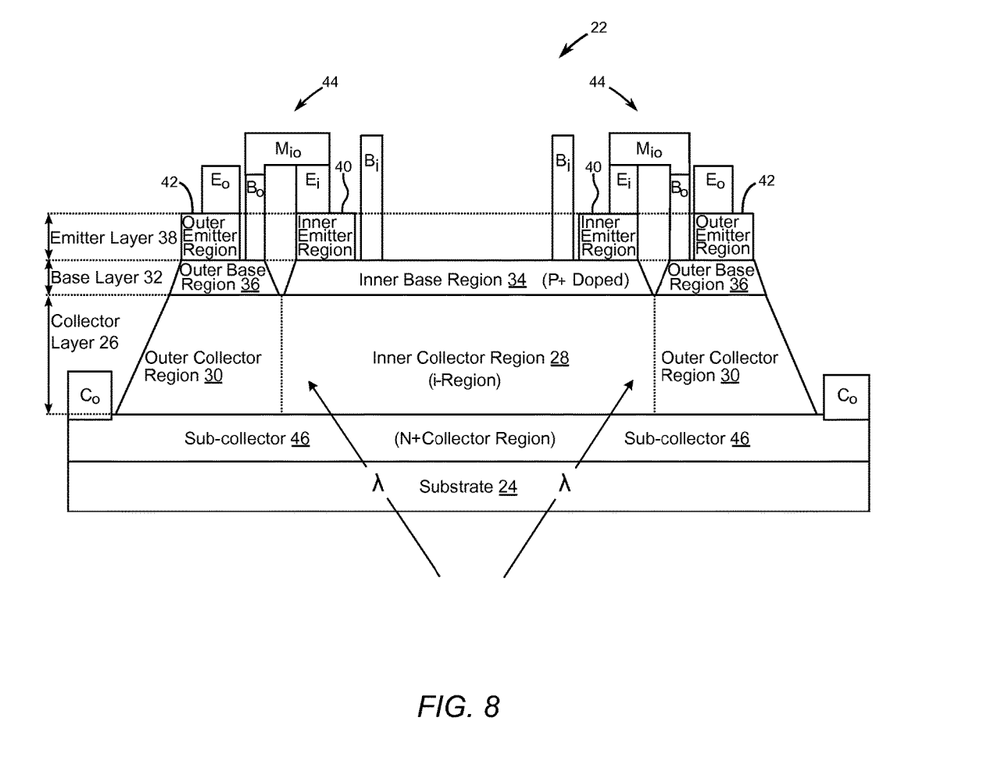
FIG. 8 is a vertical cross-section of a third embodiment of the active photonic device that is exemplarily depicted as an HBT-PD in a Darlington configuration that is adapted to receive back-side illumination from a light signal.

FIG. 8 is a vertical cross-section of a third embodiment of the active photonic device 22 that is exemplarily depicted as an HBT-PD in a Darlington configuration and is adapted to receive back-side illumination from a light signal λ. In this third embodiment, the substrate 24 is made of a material that is transparent at some light wavelengths. Backside illumination allows flip-chip packaging for the active photonic device 22. Flip-chip packaging significantly reduces the inductances associated with bond wires that typically couple to the outer collector contact $C_O$, the outer emitter contact $E_O$, and the inner base contact $B_i$. As a result of lower inductances, this third embodiment of the active photonic device 22 allows operation at even higher modulation frequencies and data rates provided by the light signal λ.

Figure 9:
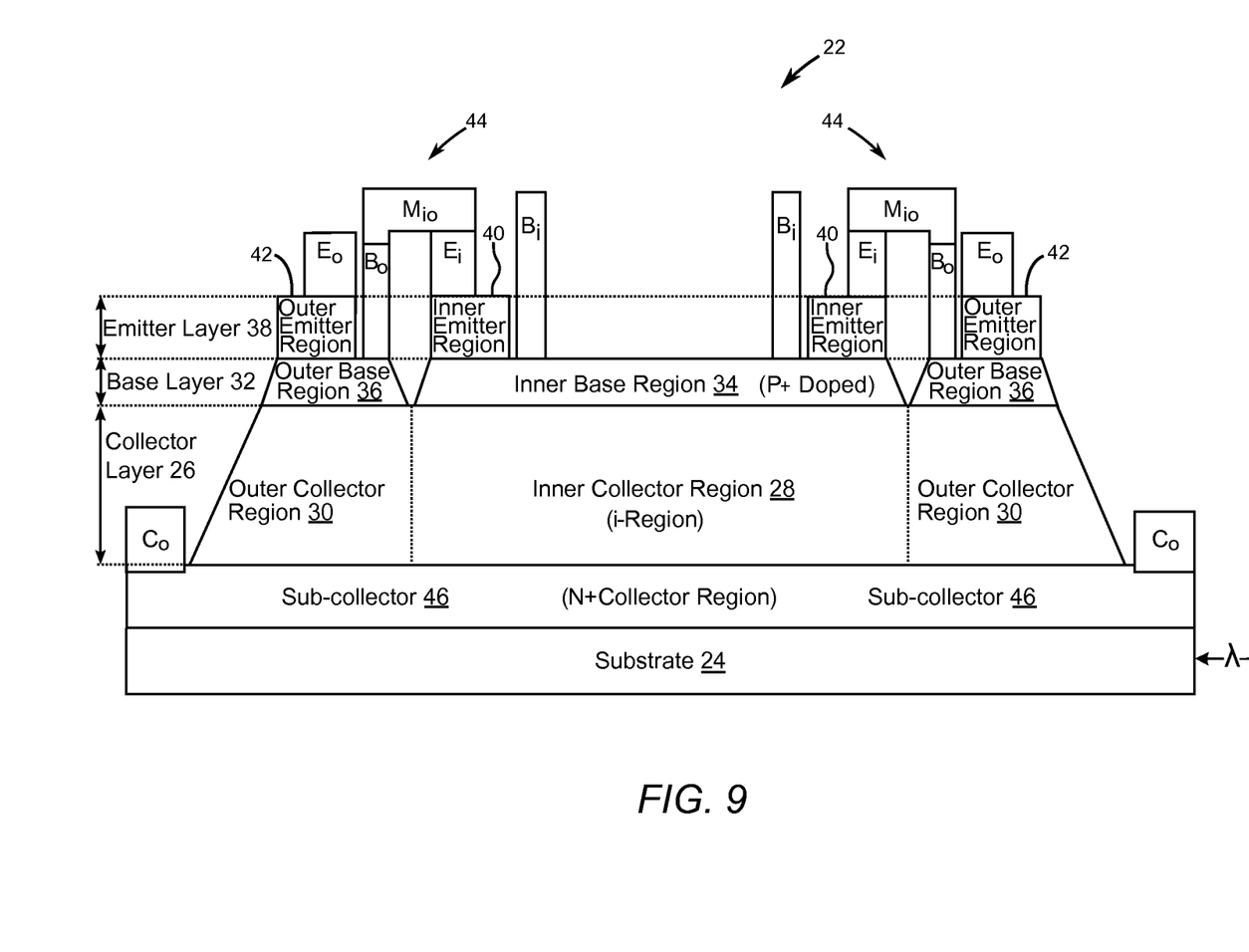
FIG. 9 is a vertical cross-section of a fourth embodiment of the active photonic device that is exemplarily depicted as an HBT-PD in a Darlington configuration that is adapted to receive edge illumination from a light signal.

FIG. 9 is a vertical cross-section of a fourth embodiment of the active photonic device that is exemplarily depicted as an HBT-PD in a Darlington configuration and is adapted to receive edge illumination from a light signal. This fourth embodiment of the active photonic device 22 provides a convenient physical configuration for some applications. It is to be understood that the second embodiment of the active photonic device 22 depicted in FIG. 6 and FIG. 7 can also be fabricated with substrate materials that are transparent at certain light wavelengths. As such, the second embodiment of the active photonic device 22 can also be used with back-side illumination and edge illumination applications.

In at least one embodiment, an exemplary material for the sub-collector 46, the collector layer 26, and the base layer 32 is indium gallium arsenide (InGaAs), and an exemplary material for the emitter layer 38 is indium aluminum arsenide (InAlAs). An exemplary material for the substrate 24 is indium phosphide (InP). In yet other embodiments, an exemplary material for the sub-collector 46, the collector layer 26, and the base layer 32 is GaAs, and an exemplary material for the emitter layer 38 is InGaP. In either case, the GaAs or InGaAs is N+ doped in the sub-collector 46, undoped or lightly doped in the inner collector region 28, and P+ doped in the inner base region 34.

Figure 10:
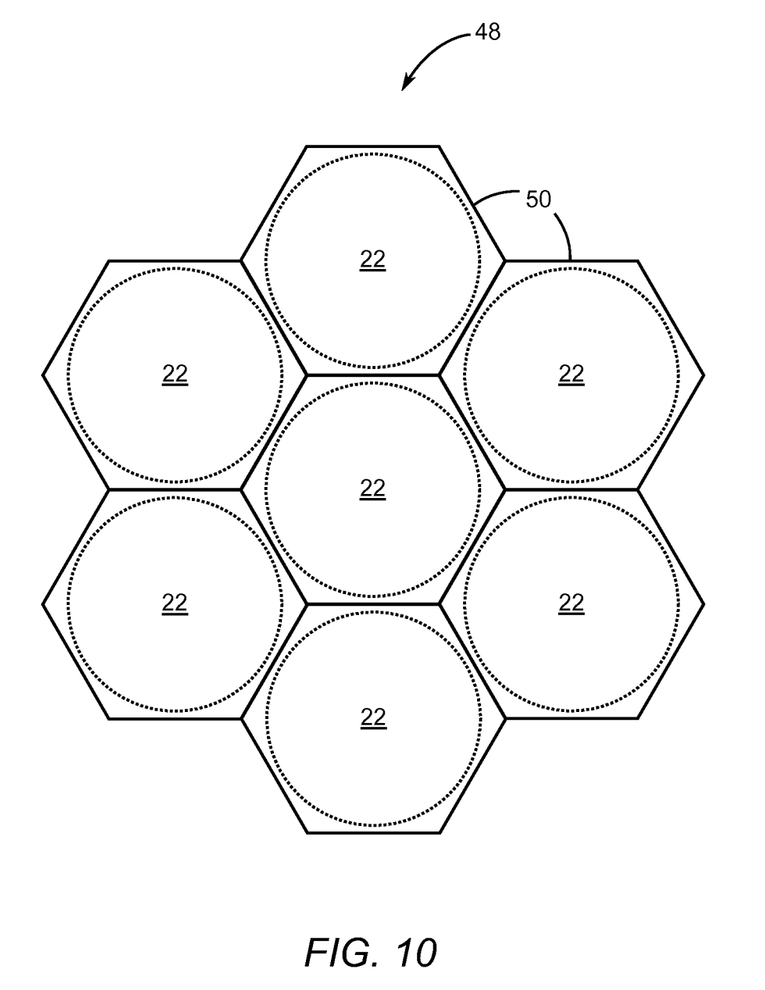
FIG. 10 is a simplified top view diagram of a photodetector array made up of a plurality of the active photonic device of the present disclosure.

FIG. 10 is a simplified top view diagram of a photodetector array 48 made up of a plurality of the active photonic device 22. An ohmic contact 50 coupled to the collector layer 26 is polygon shaped in at least one embodiment of the active photonic device 22. In an exemplary embodiment, the ohmic contact 50 is hexagonal shaped. The collector layer 26 is represented by a dashed circle because in this exemplary embodiment a light signal is received from the backside. Due to the hexagonal shape, the photodetector array 48 is efficient with regard to footprint and detector area. As such, applications of this disclosure extend into high data-rate serial and/or parallel communications as well as compact voltaic solar cells wherein the disclosed ring-shaped regions have a multi-quantum structure with high spectral absorption/detection of light, which is typical of triple or multi-quantum well structures.

Those skilled in the art will recognize improvements and modifications to the embodiments of the present disclosure. All such improvements and modifications are considered within the scope of the concepts disclosed herein and the claims that follow.

What is claimed is:

1. An active photonic device having a Darlington configuration comprising:
    a substrate;
    a collector layer over the substrate and comprising:
        an inner collector region; and
        an outer collector region that substantially surrounds the inner collector region, wherein the outer collector region is physically isolated from the inner collector region by a gap;
    a base layer over the collector layer comprising:
        an inner base region; and
        an outer base region that substantially surrounds and is spaced apart from the inner base region;
    an emitter layer over the base layer and comprising:
        an inner emitter region that is ring-shaped and resides over and extends substantially around an outer periphery of the inner base region;

an outer emitter region that is ring-shaped and resides over and extends substantially around the outer base region; and a connector structure that electrically couples the inner emitter region with the outer base region.

2. The active photonic device of claim 1 further including a sub-collector that resides between the collector layer and substrate.

3. The active photonic device of claim 1 wherein the inner collector region, the inner base region and the inner emitter region form a first transistor, and the outer collector region, the outer base region, and the outer emitter region form a second transistor.

4. The active photonic device of claim 3 wherein the first transistor and second transistor are configured as a heterojunction bipolar transistor-photonic device (HBT-PD).

5. The active photonic device of claim 1 wherein the inner base region is a P-layer that is p-doped, the inner collector region is an i-layer that is intrinsic, and a sub-collector residing between the substrate and collector layer is an N-layer that is n-doped to form a P-i-N structure.

6. The active photonic device of claim 5 wherein the inner collector region is undoped.

7. The active photonic device of claim 5 wherein the inner collector region is lightly doped.

8. The active photonic device of claim 1 wherein the inner collector region and the outer collector region are contiguous.

9. The active photonic device of claim 1 wherein the substrate is transparent to at least one wavelength of light.

10. The active photonic device of claim 9 wherein a light signal is back-side coupled through the substrate.

11. The active photonic device of claim 10 configured for flip-chip packaging.

12. The active photonic device of claim 9 wherein a light signal is edge coupled through the substrate.

13. The active photonic device of claim 1 further including a polygon shaped ohmic contact coupled to the collector layer.

14. The active photonic device of claim 13 wherein the polygon shaped ohmic contact is configured to mechanically and electrically couple to a plurality of a similarly configured active photonic device.

15. The active photonic device of claim 1 configured to operate at a supply voltage from 1V to 5V.

16. The active photonic device of claim 1 configured to operate at a supply voltage from 5V to 10V.

17. The active photonic device of claim 1 wherein the collector layer and the base layer are made of gallium arsenide (GaAs).

18. The active photonic device of claim 1 wherein the collector layer and the base layer are made of indium gallium arsenide (InGaAs).

19. The active photonic device of claim 1 wherein the emitter layer is made of indium gallium phosphide (InGaP).

20. The active photonic device of claim 1 wherein the emitter layer is made of indium aluminum arsenide (InAlAs).

21. The active photonic device of claim 1 configured to receive a modulated light signal with a bit rate of at least 100 Gbps and output an electrical signal of at least 100 Gbps.

22. A method of manufacturing an active photonic device having a Darlington configuration comprising:
  providing a substrate;
  disposing a collector layer over the substrate and comprising:
    an inner collector region; and
    an outer collector region that substantially surrounds the inner collector region, wherein the outer collector region is physically isolated from the inner collector region by a gap;
  disposing a base layer over the collector layer comprising:
    an inner base region; and
    an outer base region that substantially surrounds and is spaced apart from the inner base region;
  disposing an emitter layer over the base layer and comprising:
    an inner emitter region that is ring-shaped and resides over and extends substantially around an outer periphery of the inner base region;
    an outer emitter region that is ring-shaped and resides over and extends substantially around the outer base region; and
  fabricating a connector structure that electrically couples the inner emitter region with the outer base region.

23. An active photonic device having a Darlington configuration comprising:
  a substrate;
  a collector layer over the substrate and comprising:
    an inner collector region; and
    an outer collector region that substantially surrounds the inner collector region;
  a base layer over the collector layer comprising:
    an inner base region configured to directly receive a light signal; and
    an outer base region that substantially surrounds and is spaced apart from the inner base region;
  an emitter layer over the base layer and comprising:
    an inner emitter region that is ring-shaped and resides over and extends substantially around an outer periphery of the inner base region;
    an outer emitter region that is ring-shaped and resides over and extends substantially around the outer base region; and
  a connector structure that electrically couples the inner emitter region with the outer base region.

* * * * *